(12) United States Patent
Hong

(10) Patent No.: US 7,396,763 B2
(45) Date of Patent: Jul. 8, 2008

(54) SEMICONDUCTOR PACKAGE USING FLEXIBLE FILM AND METHOD OF MANUFACTURING THE SAME

(75) Inventor: Jae-young Hong, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 357 days.

(21) Appl. No.: 11/377,324

(22) Filed: Mar. 15, 2006

(65) Prior Publication Data

US 2006/0157830 A1     Jul. 20, 2006

Related U.S. Application Data

(62) Division of application No. 10/895,761, filed on Jul. 20, 2004, now Pat. No. 7,042,104.

(30) Foreign Application Priority Data

Aug. 13, 2003  (KR) .............................. 2003-56010

(51) Int. Cl.
*H01L 21/44* (2006.01)

(52) U.S. Cl. .................... 438/652; 438/669

(58) Field of Classification Search ................ 438/111, 438/118, 119, 123, 618, 614, 652, 669, 624, 438/622

See application file for complete search history.

(56) References Cited

U.S. PATENT DOCUMENTS 5,471,151 A * 11/1995 DiFrancesco ................ 324/757

| 5,530,282 A | 6/1996 | Tsuji |
| 6,084,294 A | 7/2000 | Tomita |
| 6,476,467 B2 | 11/2002 | Nakamura et al. |
| 6,528,870 B2 | 3/2003 | Fukatsu et al. |

(Continued)

FOREIGN PATENT DOCUMENTS

JP          61-005535       1/1986

(Continued)

OTHER PUBLICATIONS

English language abstract of Korean Publication No. 1997-0003894.

(Continued)

*Primary Examiner*—S. V. Clark
(74) *Attorney, Agent, or Firm*—Marger Johnson & McCollom, P.C.

(57) ABSTRACT

A semiconductor package and a method of manufacturing the same: The package includes a substrate, an external connection terminal portion on at least one edge thereof; a semiconductor chip bonded to the substrate, the semiconductor chip including a plurality of bonding pads; and a flexible film, which electrically connects the semiconductor chip to the external connection terminal portion. The flexible film includes an insulating film; a plurality of first terminals extending through the insulating film, the first terminals contacting external connection terminals of the external connection terminal portion; a plurality of second terminals extending through the insulating film and spaced a predetermined distance apart from the first terminals, the second terminals contacting the bonding pads; and conductive line patterns formed on a top surface of the insulating film, the conductive line patterns electrically connecting the first terminals to the second terminals that respectively correspond to the first terminals.

14 Claims, 6 Drawing Sheets

U.S. PATENT DOCUMENTS 6,841,855 B2 * 1/2005 Jaeck et al. .................. 257/668
7,009,293 B2 * 3/2006 Hashimoto .................. 257/730
7,071,567 B2 * 7/2006 Koizumi ..................... 257/777

FOREIGN PATENT DOCUMENTS

| JP | 8-17870 | 1/1996 |
| KR | 1997-0003894 | 1/1997 |

OTHER PUBLICATIONS

English language abstract of Japanese Publication No. 61-005535.
English language abstract of Japanese Publication No. 8-17870.

* cited by examiner

SEMICONDUCTOR PACKAGE USING FLEXIBLE FILM AND METHOD OF MANUFACTURING THE SAME

This application is a Divisional of U.S. patent application Ser. No. 10/895,761, filed Jul. 20, 2004, now U.S. Pat. No. 7,042,104, which claims priority from Korean Patent Application No. 2003-56010, filed on Aug. 13, 2003, which is incorporated by reference in its entirety.

BACKGROUND OF THE INVENTION

1. Field of the Invention

The present invention relates to a semiconductor package and to a method of manufacturing the same, and more particularly to a semiconductor package using a flexible film for wire bonding.

2. Description of the Related Art

In order to decrease the size and at the same time increase the capability and operating speed of devices such as portable electronic products a need has developed for scaling down of semiconductor packages. Such small size packages must be able to package semiconductor circuits that have high capabilities and high operating speed.

In order to reduce the size of semiconductor packages, a chip scale package (CSP), has been proposed. A CSP is a semiconductor package that is only slightly larger than the size of a semiconductor chip.

A stack package is a known type of semiconductor package. A stack package can accommodate a high density of semiconductor chips and it can be multi-functional. A conventional stack package is shown in FIGS. 1 and 2. FIG. 1 is a plan view of a conventional stack package, and FIG. 2 is a cross-sectional view of the stack package along line II-II' of FIG. 1.

As shown in FIGS. 1 and 2, the stack package comprises a substrate 10. Lead portions 15, each of which includes a plurality of leads 16, are disposed on opposite edges of the substrate 10. A first semiconductor chip 20 and a second semiconductor chip 30 are sequentially bonded to the substrate 10 between the lead portions 15. The first and second semiconductor chips 20 and 30 are bonded to the substrate 10 by an adhesive 12. Bonding pads 20a and 30a are formed on edges of the first and second semiconductor chips 20 and 30, respectively. The second semiconductor chip 30 is bonded to the first semiconductor chip 20 such that the bonding pads 20a of the first semiconductor chip 20 are exposed.

The bonding pads 20a and 30a of the first and second semiconductor chips 20 and 30 are electrically connected to the leads 16, which are external connection terminals, by wires 40. The first and second semiconductor chips 20 and 30 are molded by an epoxy molding compound (EMC) (not shown).

In general, when the semiconductor packages and stack packages are scaled down, the pitch size between adjacent wires must be decreased and the length of the wires must be increased. Thus, a short between wires can easily occur. In particular, when an EMC is formed, even a slight shock may cause a wire to bend or sag toward an adjacent wire. A bend or sag can cause a short between wires which is a very serious matter. Reference character A of FIG. 1 illustrates a short between wires in a horizontal direction, and B of FIG. 2 illustrates a short between wires in a vertical direction.

Also, a conventional wire bonding technique is a relatively slow process since the bonding pads are wire-bonded to the leads on a one-to-one basis.

SUMMARY OF THE INVENTION

According to an aspect of the present invention, there is provided a semiconductor package, comprising a substrate, on at least one edge of which an external connection terminal portion having external connection terminals bonded is formed; a semiconductor chip bonded to the substrate and spaced a predetermined distance from the external connection terminal portion, the semiconductor chip comprising a plurality of bonding pads; and a flexible film, which electrically connects a plurality of bonding pads of the semiconductor chip to the external connection terminals.

The package can include a second semiconductor chip bonded to the first semiconductor chip such that the bonding pads of the first semiconductor chip are exposed, the second semiconductor chip including a plurality of bonding pads; and a second flexible film, which electrically connects the leads to the bonding pads of the second semiconductor chip.

Each of the first flexible film and the second flexible film can comprise an insulating film, which is flexible; and a plurality of conductive line patterns formed on a top surface of the insulating film, the conductive line patterns connecting the leads to the bonding pads of the first semiconductor chip and the second semiconductor chip.

The first flexible film can comprise an insulating film having a size that is sufficient to cover the lead portion and the first semiconductor chip; a first adhesive, which bonds the first semiconductor chip to a predetermined portion of a bottom surface of the insulating film; a second adhesive, which bonds the second semiconductor chip to a predetermined portion of the top surface of the insulating film.

The semiconductor package can further comprise dummy terminals disposed between the first terminals and/or between the second terminals, the dummy terminals contacting the leads and/or the bonding pads.

According to further another embodiment of the present invention, there is provided a method of manufacturing a semiconductor package as described above.

The bonding of the flexible film to the bonding pads of the semiconductor chip and the leads can be done by applying one selected from the group consisting of heat, pressure, and ultrasonic waves to the flexible film.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
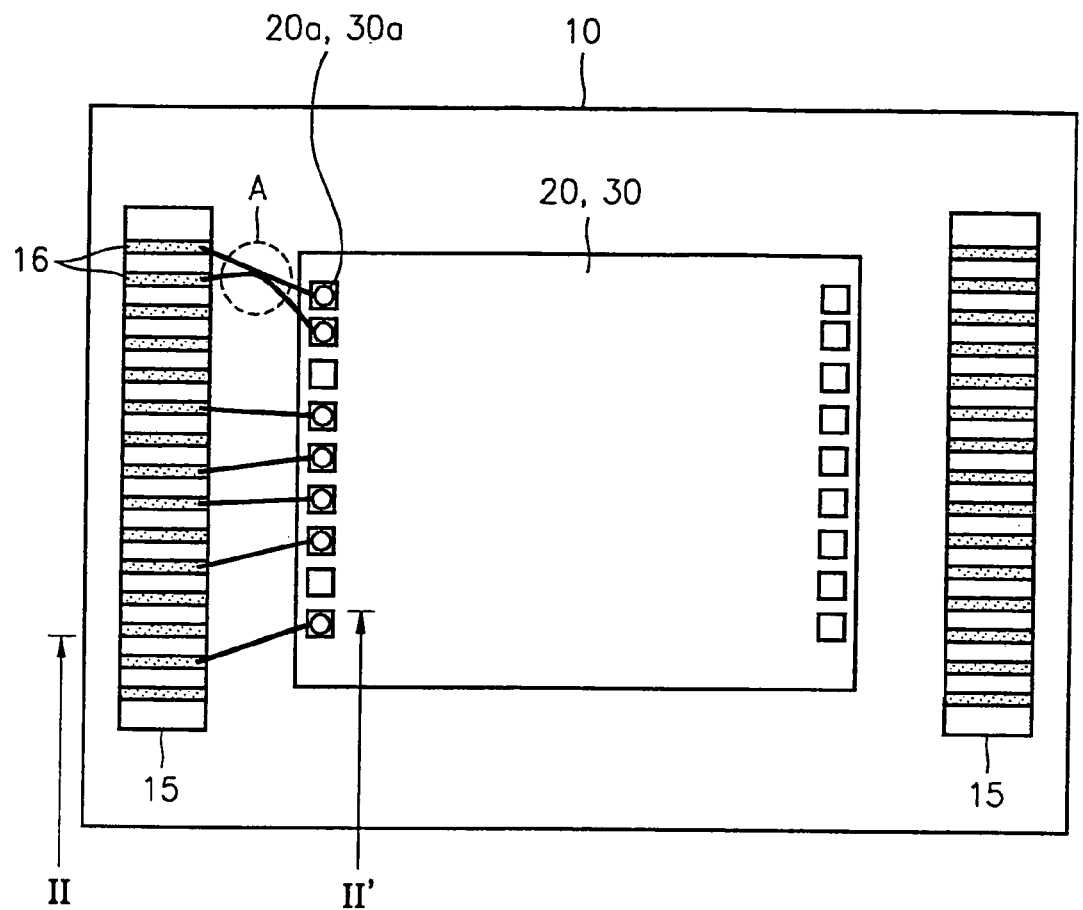
FIG. 1 is a plan view of a conventional stack package.
Figure 2:
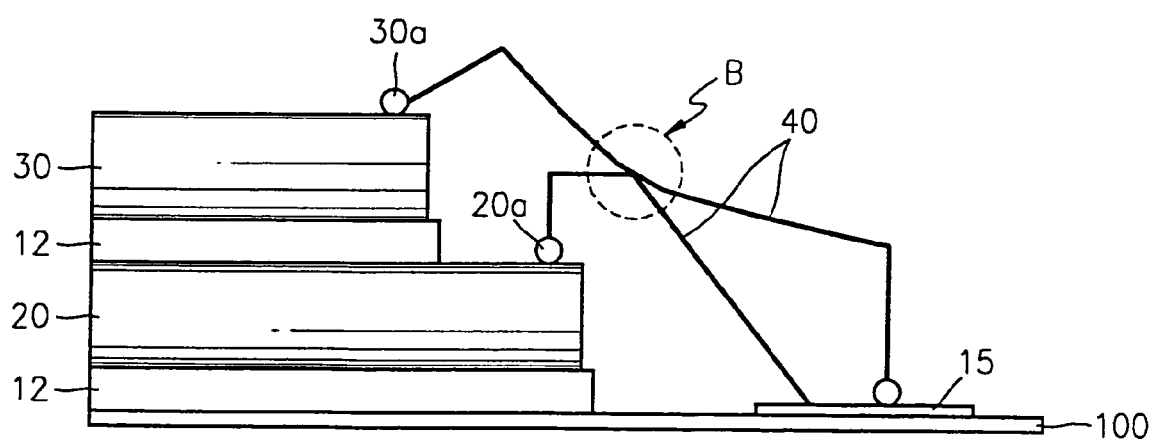
FIG. 2 is a cross-sectional view taken along line II-II' of FIG. 1.

The present invention will now be described more fully with reference to the accompanying drawings, in which exemplary embodiments of the invention are shown. This invention may, however, be embodied in many different forms and should not be construed as being limited to the embodiments set forth herein. Rather, these embodiments are provided so that this disclosure is thorough and complete and fully conveys the concept of the invention to those skilled in the art. In the drawings, the thicknesses of layers may be exaggerated for clarity, and the same reference numerals are used to denote the same elements throughout the drawings.

Figure 3:
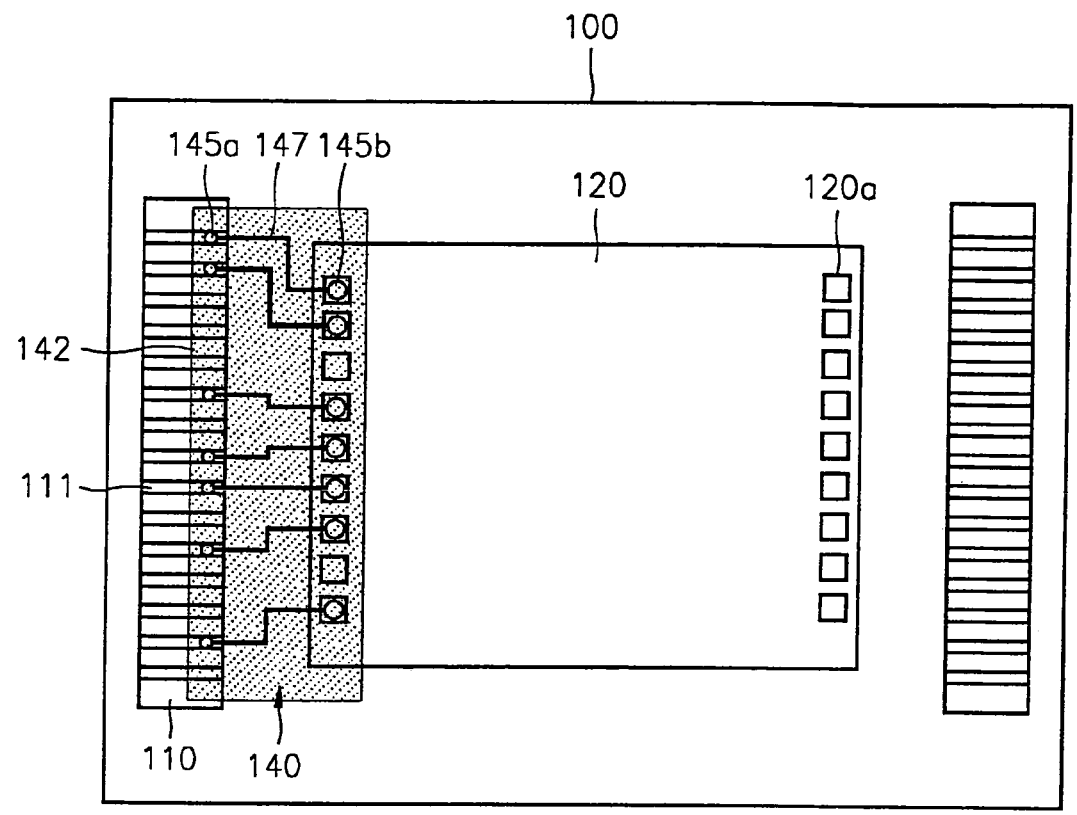
FIG. 3 is a plan view of a semiconductor package using a flexible film according to an embodiment of the present invention.
Figure 4:
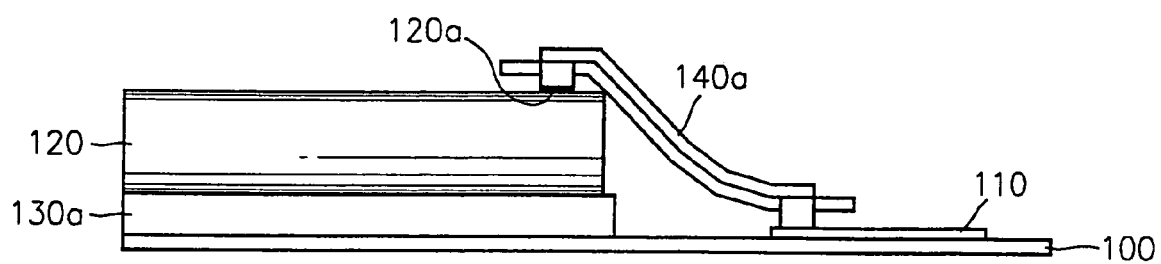
FIG. 4 is a cross-sectional view of the semiconductor package of FIG. 3.

FIG. 3 is a plan view of a semiconductor package using a flexible film according to an embodiment of the present invention. FIG. 4 is a cross-sectional view of the semiconductor package of FIG. 3.

Referring to FIGS. 3 and 4 show a substrate 100 and a semiconductor chip 120. The substrate 100 may be an insulating substrate or a printed circuit board (PCB). Two lead portions 110 are bonded to opposite edges of the substrate 100. The lead portions 110 are spaced a predetermined distance, i.e., a width of a semiconductor chip, apart from each other. Each of the lead portions 110 includes a plurality of leads 111, which are arranged in series at predetermined intervals.

A first semiconductor chip 120 is bonded to the substrate 100 between the lead portions 110 by a first adhesive 130a. A plurality of first bonding pads 120a may be arranged on top edges of the first semiconductor chip 120. A first flexible film 140a is formed in a space between the first semiconductor chip 120 and one of the lead portions 110 and overlaps a portion of the first semiconductor chip 120 and a portion of one of the lead portions 110. The first flexible film 140a includes conductive line patterns 147, which electrically connect the first bonding pads 120a to the leads 111.

Figure 5:
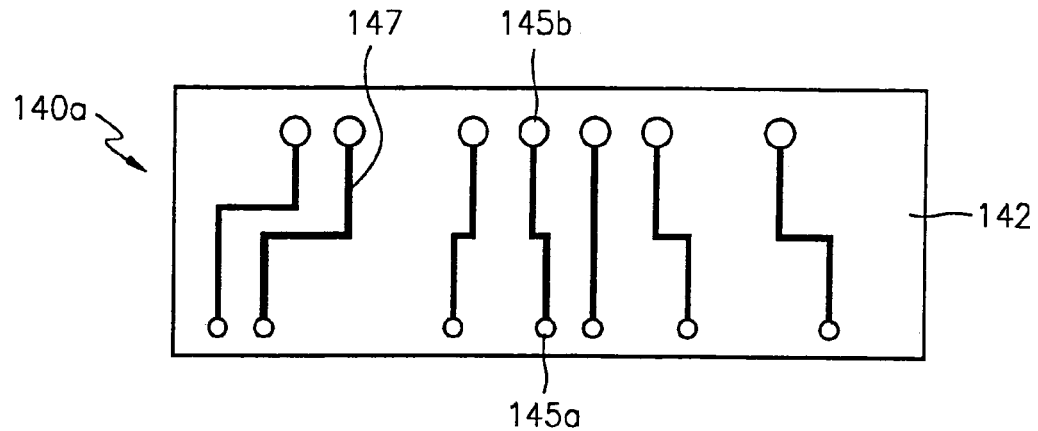
FIG. 5 is a plan view of the flexible film of FIG. 3.
Figure 6:
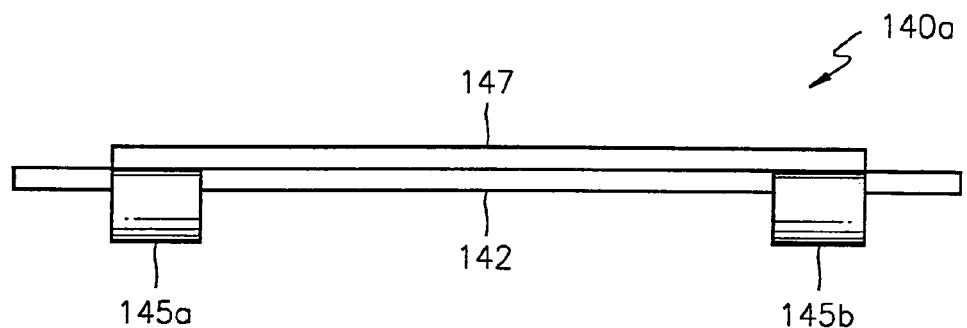
FIG. 6 is a cross-sectional view of the flexible film of FIG. 5.

FIG. 5 is a plan view of the flexible film of FIG. 3, and FIG. 6 is a cross-sectional view of the flexible film of FIG. 5. Referring to FIGS. 5 and 6, the first flexible film 140a is formed of a flexible insulating film 142, for example, a polyimide film. A plurality of first terminals 145a and a plurality of second terminals 145b are disposed in predetermined regions of the insulating film 142, respectively. The first terminals 145a are spaced a predetermined distance, that is, the distance between the first semiconductor chip 120 and the one of the lead portions 110, from the second terminals 145b. The first terminals 145a are arranged in a row parallel to a row in which the second terminals 145b are arranged. The first terminals 145a are intended to contact the leads 111, which are arranged in a row, and the second terminals 145b are intended to contact the first bonding pads 120a, which are arranged in a row parallel to the row in which the first terminals 145a are arranged.

The first and second terminals 145a and 145b are formed through the insulating film 142 and can protrude from a bottom surface (a first surface) of the insulating film 142. Conductive line patterns 147 are formed on a top surface (a second surface) of the insulating film 142 and electrically connect the first terminals 145a to the second terminals 145b. Adjacent conductive line patterns 147 are spaced a predetermined distance apart from each other. The conductive line patterns 147 can be, for example, copper interconnections or gold-plated copper interconnections.

The first flexible film 140a is bonded to the portions of the first semiconductor chip 120 and the one of the lead portions 110 such that the first terminals 145a contact the leads 111 and the second terminals 145b contact the first bonding pads 120a. Thus, the first bonding pads 120a, which are arranged in a row, are electrically connected to the leads 111, which are arranged in a row parallel to the row of the first bonding pads 120a.

The conductive line patterns 147, which function as wires, are electrically isolated from adjacent conductive line patterns 147 by the insulating film 142. Since the conductive line patterns 147 are fixed to the top surface of the insulating film 142, even if the conductive line patterns 147 are acted on by an external force, they do not bend or sag. Therefore, a short between connection elements for connecting the first semiconductor chip 120 to the one of the lead portions 110 is prevented.

Also, since the first flexible film 140a is flexible, even if an elevation difference exists between a top surface of one of the lead portions 110 and a top surface of the first semiconductor chip 120, due to the heights of the first semiconductor chip 120 and the first adhesive 130a, the first flexible film 140a reliably connects the first bonding pads 120a to the leads 111 without breaking the conductive line patterns 147.

Figure 7:
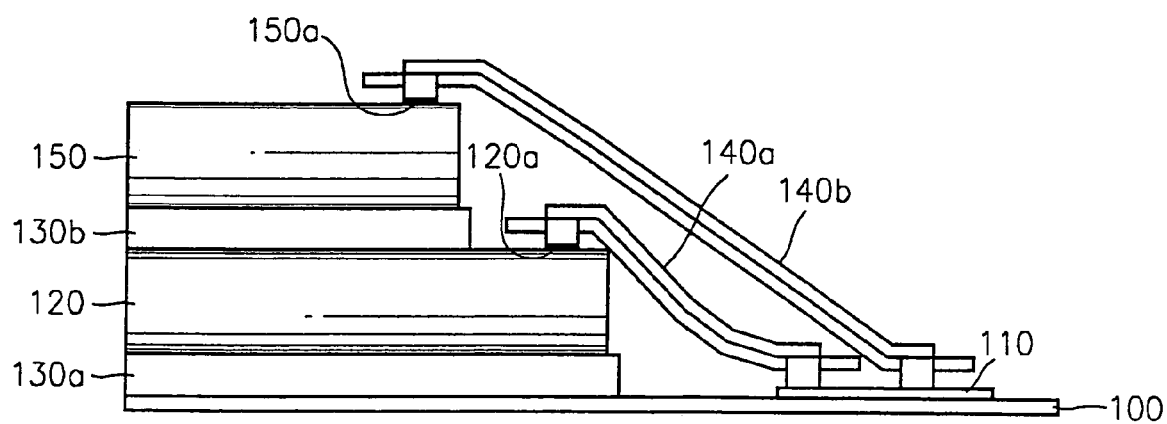
FIG. 7 is a cross-sectional view of a stack package using the flexible film of FIG. 5.

FIG. 7 is a cross-sectional view of a stack package using the flexible film of FIG. 5. Referring to FIG. 7, a second semiconductor chip 150 can be bonded to the top surface of the first semiconductor chip 120 by a second adhesive 130b. Thus, a stack package can be formed. Likewise, second bonding pads 150a of the second semiconductor chip 150 are electrically connected to the leads 111 by a second flexible film 140b.

In this case, the flexible films 140a and 140b are spaced a certain vertical distance apart from each other. Since the conductive line patterns 147 of the first flexible film 140a are formed on the top surface (the second surface) of the insulating film 142, even if a portion of the first flexible film 140a contacts the second flexible film 140b, a short does not occur therebetween.

Figure 8A:
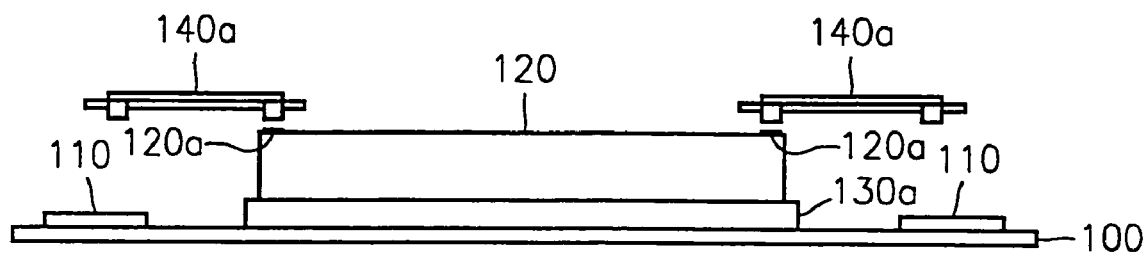
FIGS. 8A through 8D are cross-sectional views illustrating a method of manufacturing the semiconductor package using the flexible film of FIG. 3.

The method of manufacturing the semiconductor package previously described will now be described with reference to FIGS. 8A through 8D. Referring to FIG. 8A, lead portions 110 are bonded to opposite top edges of a substrate 100. A plurality of leads (111 of FIG. 3) is arranged at predetermined intervals on each of the lead portions 110. A predetermined amount of first adhesive 130a is sprayed on a top surface of the substrate 100 between the lead portions 110. The first semiconductor chip 120 is mounted on the first adhesive 130a, and the chip 120 is thermally bonded to the substrate 100. A plurality of first bonding pads 120a are located on top edges of the first semiconductor chip 120. The first semiconductor chip 120 is bonded to the substrate 100 such that the first bonding pads 120a face upward.

Thereafter, a first flexible film 140a is prepared to connect the first bonding pads 120a to the leads 111. The process of forming the first flexible film 140a will now be described.

As shown in FIG. 6, first terminal holes (not shown) and second terminal holes (not shown) are formed in predetermined portions of an insulating film 142. The first terminal holes are spaced a predetermined distance apart, that is, a distance between the first bonding pads 120a and the leads 111, apart from the second terminal holes.

A first conductive layer is deposited on a bottom surface (a first surface) of the insulating film 142 so as to fill the first and second terminal holes and patterned such that the first conductive layer remains only in the first and second terminal holes. Thus, first terminals 145a and second terminals 145b are formed on the first surface of the insulating film 142. Next, a second conductive layer is deposited on a top surface (a second surface) of the insulating film 142. A predetermined portion of the second conductive layer is etched so as to connect the first terminals 145a to the second terminals 145b, thereby forming conductive line patterns 147.

The resultant first flexible film 140a is aligned to the substrate 100 such that the first terminals 145a correspond to the leads 111 and the second terminals 145b correspond to the first bonding pads 120a.

Figure 8B:
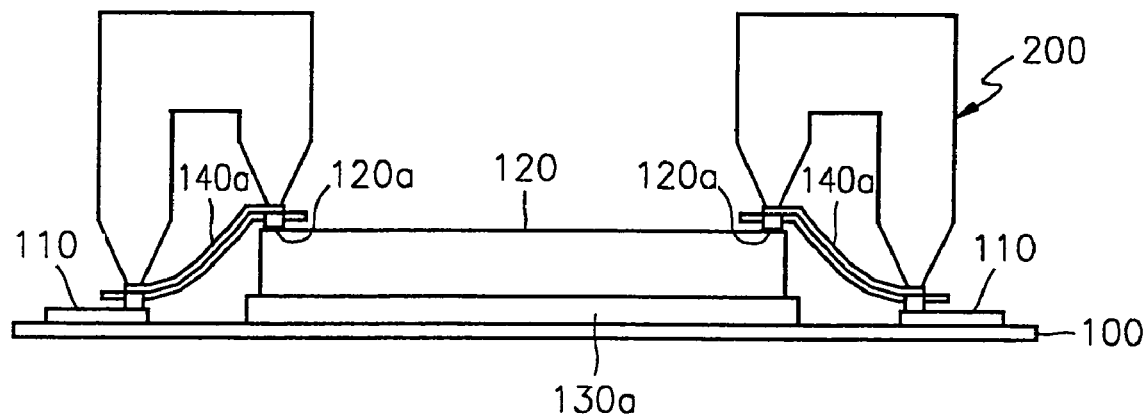

Referring to FIG. 8B, the aligned first flexible film 140a is bonded to the first bonding pads 120a and the leads 111 by bonding tools 200. When the first flexible film 140a is bonded to the first bonding pads 120a and the leads 111, heat, pressure, or ultrasonic waves can be applied to the first flexible film 140a so as to melt portions of the first and second terminals 145a and 145b.

Figure 8C:
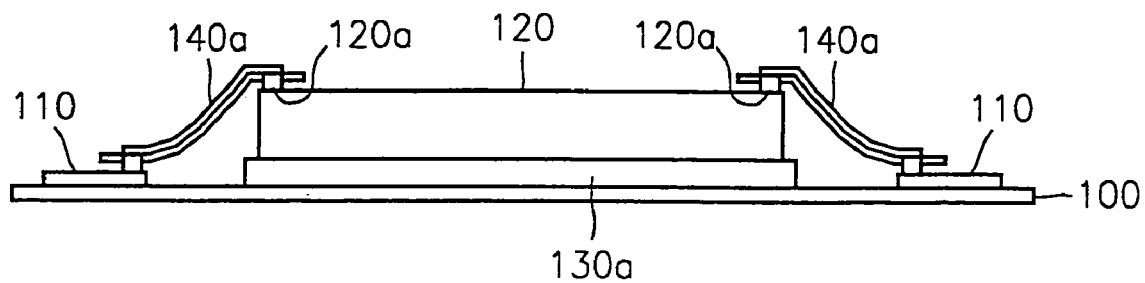

Thus, as shown in FIG. 8C, the first bonding pads 120a are electrically connected to the leads 111 by the first flexible film 140a.

Figure 8D:
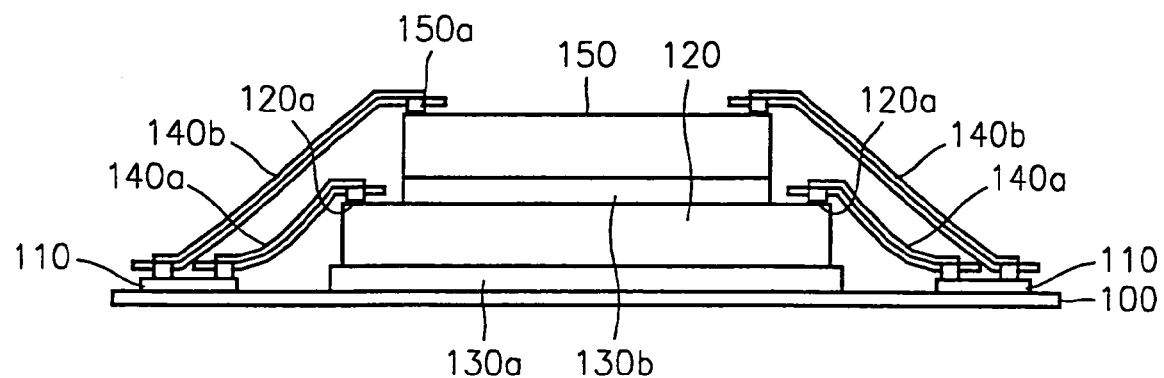

To form a stack package, as shown in FIG. 8D, a second adhesive 130b is sprayed to the first semiconductor chip 120, and a second semiconductor chip 150 is attached to the second adhesive 130b. A plurality of second bonding pads 150a are formed on top edges of the second semiconductor chip 150. The second semiconductor chip 150 is bonded to the first semiconductor chip 120 such that the first bonding pads 120a of the first semiconductor chip 120 are exposed. Thereafter, a second flexible film 140b is bonded to second bonding pads 150a and the leads 111 so as to connect the second bonding pads 150a to the leads 111 in the same manner that the first flexible film 140a connects the first bonding pads 120a of the first semiconductor chip 120 to the leads 111.

In the present embodiment, the bonding pads 120a and 150a are simultaneously electrically connected to the leads. Thus, the overall manufacturing time is greatly reduced compared with conventional one-to-one wire bonding. Further, if flexible films are used for a plurality of lead frames that are arranged in a matrix shape, manufacturing time can be considerably reduced.

Figure 9:
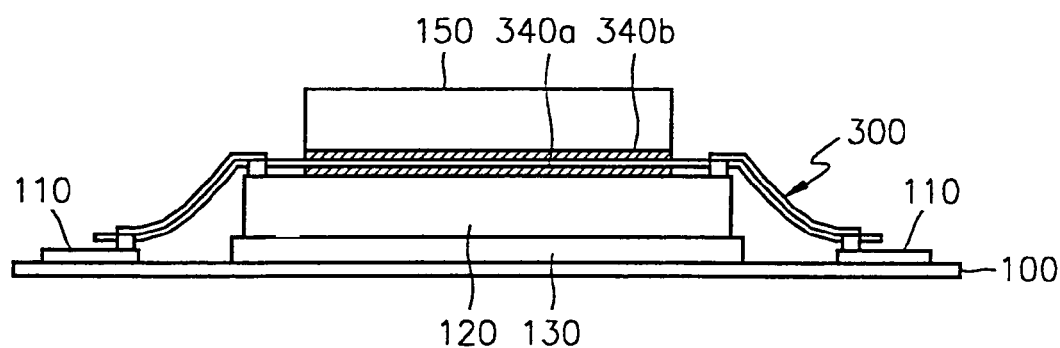
FIG. 9 is a cross-sectional view of a stack-type semiconductor package using a flexible film according to another embodiment of the present invention.
Figure 10:
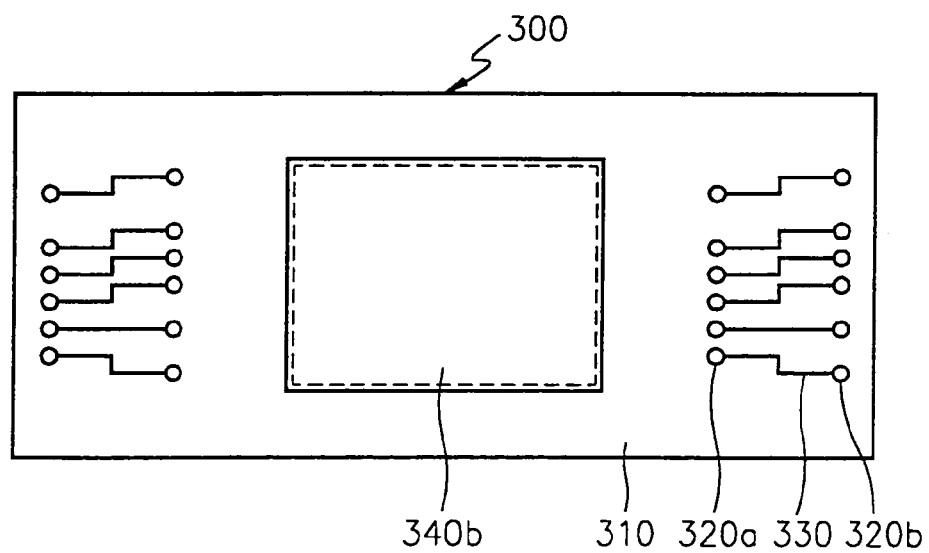
FIG. 10 is a plan view of the flexible film of FIG. 9.

FIG. 9 is a cross-sectional view of a stack-type semiconductor package using flexible films according to another embodiment of the present invention. FIG. 10 is a plan view of the flexible film shown in FIG. 9.

Referring to FIG. 9, two lead portions 110, each of which includes a plurality of leads 111, are formed on opposite edges of a substrate 100. A first semiconductor chip 120 is bonded to the substrate 100 by an adhesive 130. As described above, a plurality of bonding pads 120a are disposed on top edges of the first semiconductor chip 120.

A flexible film 300 is bonded to the substrate 100 and has a size that is sufficient to cover the first semiconductor chip 120 and the two lead portions 110.

As shown in FIG. 10, the flexible film 300 of the present embodiment comprises an insulating film 310 that has a size that is sufficient to cover the first semiconductor chip 120 and the two lead portions 110. A top adhesive 340b and a bottom adhesive 340a or top and bottom adhesive tapes (not shown) are respectively formed on top and bottom surfaces of the insulating film 310 in the center thereof. The bottom adhesive 340a bonds the flexible film 300 to the first semiconductor chip 120, and the top adhesive 340b bonds the flexible film 300 to a second semiconductor chip 150.

A plurality of first terminals 320a and a plurality of second terminals 320b are formed on a bottom surface of the insulating film 310 and spaced a predetermined distance apart from the bottom adhesive 340b. Like the terminals of the first embodiment of the present invention, the first and second terminals 320a and 320b are formed on the insulating film 310 and protrude upward from the bottom surface of the insulating film 310. The first terminals 320a are disposed so as to correspond to the bonding pads 120a of the first semiconductor chip 120, and the second terminals 320b are formed to correspond to the leads 111. Conductive line patterns 330 are formed on the top surface of the insulating film 310 and electrically connect the first terminals 320a to the second terminals 320b. That is, the conductive line patterns 330 are integrally formed in the flexible film 300.

Since the top adhesive 340b is formed on the top surface of the flexible film 300, the second semiconductor chip 150 can be bonded to the first semiconductor chip 120 without an additional adhesive. The second semiconductor chip 150 is bonded to the first semiconductor chip 120 such that bonding pads 150a of the second semiconductor chip 150 face upward. Although not shown in the drawings, another flexible film is formed such that the second bonding pads 150a of the second semiconductor chip 150 are connected to the leads 111. If a third semiconductor chip is stacked on the second semiconductor chip 150, an integral flexible film 300 of the present embodiment or a flexible film 140a or 140b of the first embodiment may be bonded to the second semiconductor chip 150.

The integral flexible film 300 of the present embodiment has the same effect as the flexible films 140a and 140b of the first embodiment. Also, the flexible film 300 and the first and second semiconductor chips 120 and 150 can be bonded to the substrate 100 simultaneously. Thus, the manufacturing of a stack package is simple, and reliable adhesion of the semiconductor chips 120 and 150 with the flexible film 300 is ensured.

Figure 11:
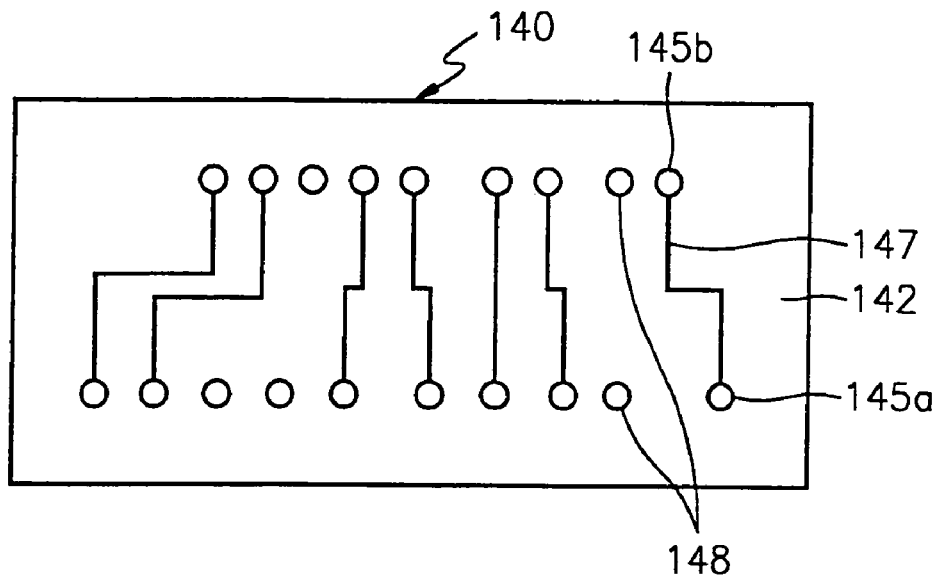
FIGS. 11 and 12 are plan views of a flexible film according to yet another embodiment of the present invention.
Figure 12:
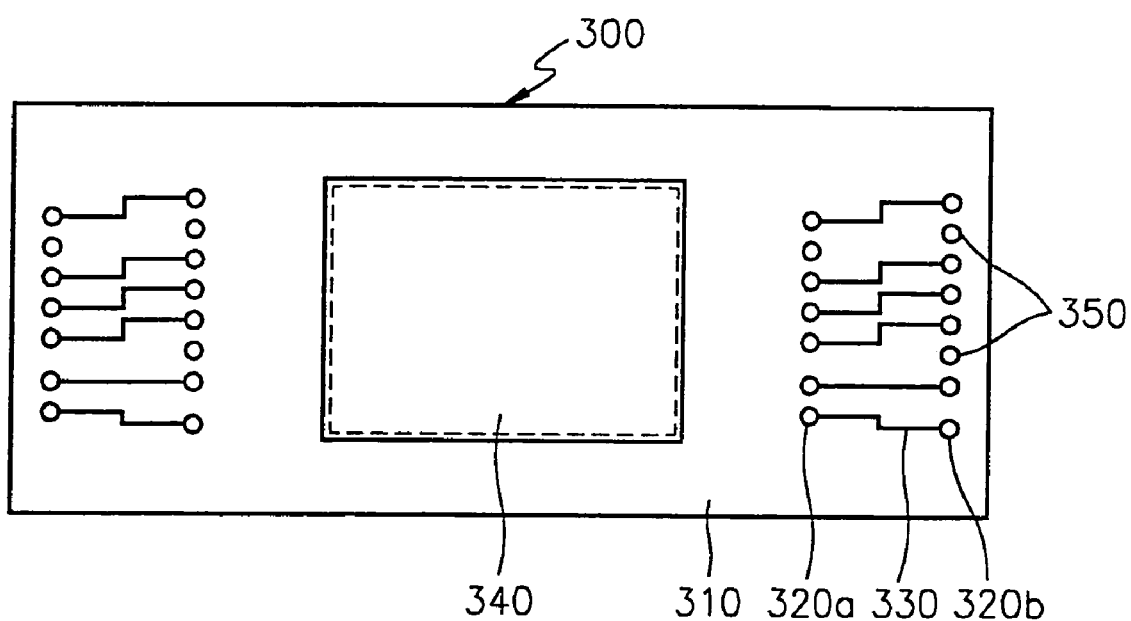

FIGS. 11 and 12 are plan views of a flexible film according to yet another embodiment of the present invention.

Referring to FIGS. 11 and 12, dummy terminals 148 and 350 are further formed between first terminals 145a or 320a and/or between second terminals 145b or 320b of a flexible film 140 or 300. The dummy terminals 148 and 350 contact bonding pads 120a or 150a, or leads 111, but are not electrically connected to terminals opposite thereto.

When the flexible film 140 or 330 is bonded to a substrate (not shown), the dummy terminals 148 or 350 are bonded to the leads 111 or the bonding pads 120a or 150a, which are not electrically connected to the first terminals 145a or 145b or the second terminals 320a or 320b. Thus, adhesion of the flexible film 140 or 330 with the substrate (or the leads 111) is reinforced.

The present invention is not limited to the above-described embodiments of the present invention.

While a flexible film connects bonding pads of a semiconductor chip to leads in the present embodiment, external signal terminals, such as pads of a PCB, can be used instead of the leads.

As explained thus far, in the present invention, leads (or external connection terminals) are electrically connected to bonding pads by a flexible substrate with conductive line patterns instead of wires.

The conductive line patterns are spaced a predetermined distance apart from each other on an insulating film of the flexible film to prevent a short between adjacent conductive line patterns. Also, since the insulating film is used as a support member that supports the conductive line patterns that serve as wires, even if an external force acts on the conductive line patterns, they do not bend or sag.

Due to the flexibility of a flexible film, even if an elevation difference exists between a top surface of one of leads and a top surface of a semiconductor chip due to the heights of the semiconductor chip and an adhesive, the flexible film can reliably connect the bonding pads to the leads without short-circuiting the conductive line patterns. Also, since the conductive line patterns of the flexible film are only formed on one surface of the flexible film, even if a portion of the lower flexible film contacts an upper flexible film, a short does not occur there between. Hence, a fine pitch between patterns can be effectively formed.

Further, conductive line patterns do not have to be elevated as high as wires, thus reducing the thickness of semiconductor packages. Also, because a plurality of bonding pads, which are arranged parallel to each other, are simultaneously connected to leads, the overall manufacturing time can be greatly reduced.

As described above, according to one aspect of the present invention, there is provided a semiconductor package, comprising a substrate; a lead portion disposed adjacent to at least one edge of the substrate, the lead portion including a plurality of leads; a semiconductor chip bonded to the substrate and spaced a predetermined distance apart from the lead portion, the semiconductor chip comprising a plurality of bonding pads; and a flexible film, which electrically connects the leads to the bonding pads. Herein, the flexible film can comprise an insulating film, which is flexible; a plurality of first terminals extending through the insulating film, the first terminals being electrically connected to selected leads; a plurality of second terminals extending through the insulating film and spaced a predetermined distance apart from the first terminals, the second terminals being electrically connected to selected bonding pads; and conductive line patterns formed on a top surface of the insulating film, the conductive line patterns electrically connecting the first terminals to the second terminals that respectively correspond to the first terminals.

According to another aspect of the present invention, there is provided a semiconductor package, comprising a substrate; a lead portion disposed adjacent to at least one edge of the substrate, the lead portion including a plurality of leads; a first semiconductor chip bonded to the substrate and spaced a predetermined distance from the lead portion, the first semiconductor chip comprising a plurality of bonding pads; a second semiconductor chip bonded to the first semiconductor chip such that the bonding pads of the first semiconductor chip are exposed, the second semiconductor chip comprising a plurality of bonding pads; a first flexible film, which electrically connects the leads to the bonding pads of the first semiconductor chip; and a second flexible film, which electrically connects the leads to the bonding pads of the second semiconductor chip.

Each of the first flexible film and the second flexible film can comprise an insulating film, which is flexible; a plurality of first terminals extending through the insulating film, the first terminals being electrically connected to selected leads; a plurality of second terminals extending through the insulating film and spaced a predetermined distance apart from the first terminals, the second terminals being electrically connected to selected bonding pads; and conductive line patterns formed on a top surface of the insulating film, the conductive line patterns connecting the first terminals to the second terminals that respectively correspond to the first terminals. The first flexible film can be disposed so as to overlap a portion of the first semiconductor chip and a portion of the lead portion, and the second flexible film can be disposed so as to overlap a portion of the second semiconductor chip and the portion of the lead portion.

According to yet further another embodiment of the present invention, there is provided a method of manufacturing a semiconductor package, comprising preparing a substrate, to which a lead portion including a plurality of leads is bonded; bonding a semiconductor chip that comprises a plurality of bonding pads to one side of the lead portion; aligning a flexible film to the external connection terminal portion and the semiconductor chip, the flexible film electrically connecting the bonding pads of the semiconductor chip to the leads; and bonding the flexible film to the bonding pads of the semiconductor chip and the leads. Herein, the flexible film can comprise an insulating film, which is flexible; first terminals extending through the insulating film; second terminals extending through the insulating film and spaced a predetermined distance from the first terminals; and conductive line patterns formed on a top surface of the insulating film, the conductive line patterns electrically connecting the first terminals to the second terminals that respectively correspond to the first terminals.

According to one embodiment of the present invention, there is provided a method of manufacturing a semiconductor package, comprising (a) preparing a substrate, to which a lead portion including a plurality of leads is bonded; (b) bonding a semiconductor chip that comprises a plurality of bonding pads on one side of the lead portion; (c) aligning the flexible film to the external connection terminal portion and the semiconductor chip, the flexible film electrically connecting the bonding pads of the semiconductor chip to the leads; (d) bonding the flexible film to the bonding pads of the semiconductor chip and the leads; and (e) repeating steps (b) through (d) once or more.

The flexible film can comprise an insulating film, which is flexible; first terminals extending through the insulating film; second terminals extending through the insulating film and spaced a predetermined distance apart from the first terminals; and conductive line patterns formed on a top surface of the insulating film, the conductive line patterns electrically connecting the first terminals to the second terminals that respectively correspond to the first terminals. Herein, the aligning of the flexible film can be performed such that the first terminals correspond to the leads and the second terminals correspond to the bonding pads of the semiconductor chip.

The flexible film can comprise an insulating film having a size that is sufficient to cover the lead portion and the semiconductor chip; a first adhesive formed on a predetermined portion of a bottom surface of the insulating film, the first adhesive bonding the insulating film to a first semiconductor chip that is formed on the substrate; a second adhesive formed on a predetermined portion of a top surface of the insulating film, the second adhesive bonding the insulating film to a second semiconductor chip that is stacked on the first semiconductor chip; first terminals and second terminals extending through one side of the first adhesive, the first terminals being respectively in contact with the leads, and the second terminals being respectively in contact with the bonding pads of the first semiconductor chip; and conductive line patterns formed on the top surface of the insulating film, the conductive line patterns electrically connecting the first terminals to the second terminals that respectively correspond to the first terminals. Herein, the aligning of the flexible film can be performed such that the first terminals of the flexible film correspond to the leads and the second terminals of the flexible film correspond to the bonding pads of the semiconductor chip.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a semiconductor package, the method comprising:
   preparing a substrate,
   bonding an external connection terminal portion comprising a plurality of external connection terminals to the substrate;
   bonding a semiconductor chip that includes a plurality of bonding pads to one side of the external connection portion;
   aligning a flexible film to the external connection terminal portion and the semiconductor chip, the flexible film electrically connecting the bonding pads of the semiconductor chip to the external connection portion; and
   bonding the flexible film to the bonding pads of the semiconductor chip and the external connection terminals of the external connection terminal portion,
   wherein the flexible film comprises:
      a flexible insulating film; and
      a plurality of conductive line patterns formed on a top surface of the flexible insulating film.

2. The method of claim 1, wherein the flexible film comprises first terminals extending through the flexible insulating film; second terminals extending through the flexible insulating film and spaced a predetermined distance apart from the first terminals,
   wherein the conductive line patterns electrically connect the first terminals to the second terminals that respectively correspond to the first terminals,
   wherein the aligning of the flexible film is performed such that the first terminals correspond to the external connection terminals of the external connection terminal portion, and the second terminals correspond to the bonding pads of the semiconductor chip.

3. The method of claim 1, wherein bonding of the flexible film to the bonding pads of the semiconductor chip and the external connection terminal portion includes applying to the flexible film one selected from the group consisting of heat, pressure, and ultrasonic waves.

4. A method of manufacturing a semiconductor package, the method comprising:
   preparing a substrate, to which a lead portion comprising a plurality of leads is bonded;
   bonding a semiconductor chip that includes a plurality of bonding pads to one side of the lead portion;
   aligning a flexible film to the external connection terminal portion and the semiconductor chip, the flexible film electrically connecting the bonding pads of the semiconductor chip to the leads; and
   bonding the flexible film to the bonding pads of the semiconductor chip and the leads,
   wherein the flexible film comprises an insulating film, which is flexible; first terminals extending through the insulating film; second terminals extending through the insulating film and spaced a predetermined distance from the first terminals; and conductive line patterns formed on a top surface of the insulating film, the conductive line patterns electrically connecting first terminals to the second terminals that respectively correspond to the first terminals.

5. A method of manufacturing a semiconductor package, the method comprising:
   (a) preparing a substrate which includes a lead portion bonded thereto, the lead portion comprising a plurality of leads;
   (b) bonding a semiconductor chip that includes a plurality of bonding pads on one side of the lead portion;
   (c) aligning a flexible film to the lead portion and to the semiconductor chip, the flexible film electrically connecting the bonding pads of the semiconductor chip to the leads;
   (d) bonding the flexible film to the bonding pads of the semiconductor chip and to the leads; and
   (e) repeating steps (b) through (d) once or more,
   wherein the flexible film comprises:
      a flexible insulating film; and
      a plurality of conductive line patterns formed on a top surface of the flexible insulating film.

6. A method of manufacturing a semiconductor package, the method comprising:
   providing a first flexible film, the first flexible film comprising a first flexible insulating film and a first plurality of conductive line patterns on the top surface of the first flexible insulating film; and
   bonding the first flexible film between a first plurality of leads of a substrate and a first plurality of bonding pads of a first semiconductor chip, wherein one of the first plurality of leads of the substrate is electrically connected to a corresponding one of the first plurality of bonding pads of the first semiconductor chip via one of the first plurality of conductive line patterns.

7. The method of claim 6, wherein providing the first flexible film comprises:
   providing a plurality of first terminals through the first flexible insulating film; and
   providing a plurality of second terminals through the first flexible insulating film,
   wherein one of the plurality of first terminals is electrically connected to a corresponding one of the plurality of second terminals via one of the first plurality of conductive line patterns.

8. The method of claim 7, wherein providing the first flexible film further comprises providing a dummy terminal between adjacent ones of the plurality of first terminals.

9. The method of claim 7, wherein providing the first flexible film further comprises providing a dummy terminal between adjacent ones of the plurality of second terminals.

10. The method of claim 6, wherein bonding the first flexible film between the first plurality of leads and the first plurality of bonding pads includes applying heat, pressure, or ultrasonic waves to first flexible film.

11. The method of claim 6, further comprising:
   providing a second flexible film, the second flexible film comprising a second flexible insulating film and a second plurality of conductive line patterns on the top surface of the second flexible insulating film; and
   bonding the second flexible film between a second plurality of leads of the substrate and a plurality of bonding pads of a second semiconductor chip, wherein one of the second plurality of leads of the substrate is electrically connected to a corresponding one of the plurality of bonding pads of the second semiconductor chip via one of the plurality of second conductive line patterns.

12. The method of claim 11, further comprising bonding the second semiconductor chip to the first semiconductor chip.

13. The method of claim 6, further comprising:
providing a second flexible film, the second flexible film comprising a second flexible insulating film and a second plurality of conductive line patterns on the top surface of the second flexible insulating film; and
bonding the second flexible film between a second plurality of leads of the substrate and a second plurality of bonding pads of the first semiconductor chip, wherein one of the second plurality of leads of the substrate is electrically connected to a corresponding one of the second plurality of bonding pads of the first semiconductor chip via one of the plurality of second conductive line patterns.

14. The method of claim 6, wherein the first flexible film further comprises a second plurality of conductive line patterns on the top surface of the first flexible insulating film, the method further comprising:
bonding the first flexible film between a second plurality of leads of the substrate and a second plurality of bonding pads of the first semiconductor chip, wherein one of the second plurality of leads of the substrate is electrically connected to a corresponding one of the second plurality of bonding pads of the first semiconductor chip via the second plurality of conductive line patterns.

* * * * *

UNITED STATES PATENT AND TRADEMARK OFFICE
CERTIFICATE OF CORRECTION

| | | |
|---|---|---|
| PATENT NO. | : 7,396,763 B2 | Page 1 of 1 |
| APPLICATION NO. | : 11/377324 | |
| DATED | : July 8, 2008 | |
| INVENTOR(S) | : Jae-young Hong | |

It is certified that error appears in the above-identified patent and that said Letters Patent is hereby corrected as shown below:

Column 10, line 1, the words "connecting first" should read -- connecting the first --.

Signed and Sealed this

Seventh Day of October, 2008

JON W. DUDAS
*Director of the United States Patent and Trademark Office*